United States Patent
Shibata (10) Patent No.: US 10,782,365 B2
(45) Date of Patent: Sep. 22, 2020

(54) MAGNETIC FIELD SENSOR

(71) Applicant: TDK CORPORATION, Tokyo (JP)

(72) Inventor: Tetsuya Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 134 days.

(21) Appl. No.: 16/039,656

(22) Filed: Jul. 19, 2018

(65) Prior Publication Data

US 2019/0033401 A1    Jan. 31, 2019

(30) Foreign Application Priority Data

Jul. 25, 2017  (JP) .................. 2017-143448

(51) Int. Cl.
*G01R 33/09* (2006.01)
*H01F 10/32* (2006.01)

(52) U.S. Cl.
CPC ......... *G01R 33/093* (2013.01); *H01F 10/329* (2013.01); *H01F 10/3254* (2013.01)

(58) Field of Classification Search
CPC .. G01R 33/093; H01F 10/3254; H01F 10/329
USPC ........................................................ 324/252
See application file for complete search history.

(56) References Cited

U.S. PATENT DOCUMENTS

| | | | | |
|---|---|---|---|---|
| 5,821,745 A | * | 10/1998 | Makino | G01D 5/147 324/207.21 |
| 2006/0261802 A1 | * | 11/2006 | Oohashi | G06F 3/0338 324/207.21 |
| 2011/0141629 A1 | | 6/2011 | Braganca et al. | |
| 2014/0062472 A1 | * | 3/2014 | Nishikawa | G01R 33/098 324/252 |
| 2016/0250481 A1 | * | 9/2016 | Hess | G01R 33/093 607/9 |
| 2017/0293001 A1 | * | 10/2017 | Holm | G01R 33/09 |

FOREIGN PATENT DOCUMENTS

| | | | | |
|---|---|---|---|---|
| JP | 2008-064499 A | | 3/2008 | |
| JP | 2011-124574 A | | 6/2011 | |
| JP | 2016143701 A | * | 8/2016 | ............. H01L 29/82 |

OTHER PUBLICATIONS

Translation of Nakada et al.; JP2016143701 B; Pub. Date Aug. 8, 2016; (Year: 2016).*

* cited by examiner

*Primary Examiner* — Melissa J Koval
*Assistant Examiner* — Rahul Maini
(74) *Attorney, Agent, or Firm* — Oliff PLC (57) ABSTRACT

A magnetic field sensor includes: a first magnetoresistance effect element; a second magnetoresistance effect element; an output port; a signal line; and a first input terminal configured to be capable of applying a DC current or a DC voltage to the first magnetoresistance effect element. Each of the first magnetoresistance effect element and the second magnetoresistance effect element includes a first magnetic layer, a second magnetic layer, and a spacer layer disposed therebetween, the first magnetoresistance effect element and the second magnetoresistance effect element are connected through the signal line, and the output port is connected in parallel with the second magnetoresistance effect element.

12 Claims, 6 Drawing Sheets

MAGNETIC FIELD SENSOR

BACKGROUND

The present disclosure relates to a magnetic field sensor.

Priority is claimed on Japanese Patent Application No. 2017-143448, filed Jul. 25, 2017, the content of which is incorporated herein by reference.

Magnetic field sensors using spin torque resonance are known. In a spin torque oscillation magnetoresistance sensor disclosed in Japanese Unexamined Patent Application, First Publication No. 2011-124574, which is one example of a magnetic field sensor, spin torque-induced oscillation is caused by a sense current flowing through a first magnetic layer, a second magnetic layer, and a spacer layer, and the frequency of the oscillation changes in accordance with the presence of a magnetic field. The frequency of the oscillation is high. In the spin torque oscillation magnetoresistance sensor, the frequency of the oscillation is measured by measuring changes in electric resistance using a processing circuit (see Japanese Unexamined Patent Application, First Publication No. 2011-124574).

In conventional magnetic field sensors, a processing circuit measuring the frequency of oscillation according to a magnetic field is a high-frequency device, and accordingly, there are cases in which the configuration becomes complicated.

SUMMARY

It is desirable to provide a magnetic field sensor having a simple configuration.

The present disclosure is directed to a magnetic field sensor is provided including a first magnetoresistance effect element; a second magnetoresistance effect element; an output port; a signal line; and a first input terminal configured to be capable of applying a DC current or a DC voltage to the first magnetoresistance effect element, each of the first magnetoresistance effect element and the second magnetoresistance effect element includes a first magnetic layer, a second magnetic layer, and a spacer layer disposed therebetween, the first magnetoresistance effect element and the second magnetoresistance effect element are connected through the signal line, and the output port is connected in parallel with the second magnetoresistance effect element.

In the description presented here, a DC current is a current in which the direction does not change over time and includes a current in which the magnitude changes over time. Similarly, in the description presented here, a DC voltage is a voltage in which the direction does not change over time and includes a voltage in which the magnitude changes over time.

In addition, the present disclosure is directed to a magnetic field sensor is provided including: a first magnetoresistance effect element; a second magnetoresistance effect element; an output port; a signal line; and a first input terminal configured to be capable of applying a DC current or a DC voltage to the first magnetoresistance effect element, each of the first magnetoresistance effect element and the second magnetoresistance effect element includes a first magnetic layer, a second magnetic layer, and a spacer layer disposed therebetween, the first magnetoresistance effect element and the second magnetoresistance effect element are connected through the signal line, and the output port is configured to be capable of outputting a DC output voltage from the second magnetoresistance effect element.

According to the present disclosure, a magnetic field sensor can be formed to have a simple configuration.

DETAILED DESCRIPTION

Preferred embodiments of the present disclosure will be described in detail with reference to the drawings.

The present disclosure is not limited to the content described in the following embodiments. In addition, in each constituent element described below, elements that may be easily considered by a person skilled in the art, elements that are substantially the same as the constituent element, and elements in an equivalent range are to be considered as included within the scope of the disclosure. Furthermore, constituent elements described below may be combined as appropriate. In addition, various omissions, substitutions, or changes of the constituent elements may be made without departing from the concept of the present disclosure.

First Embodiment

Figure 1:
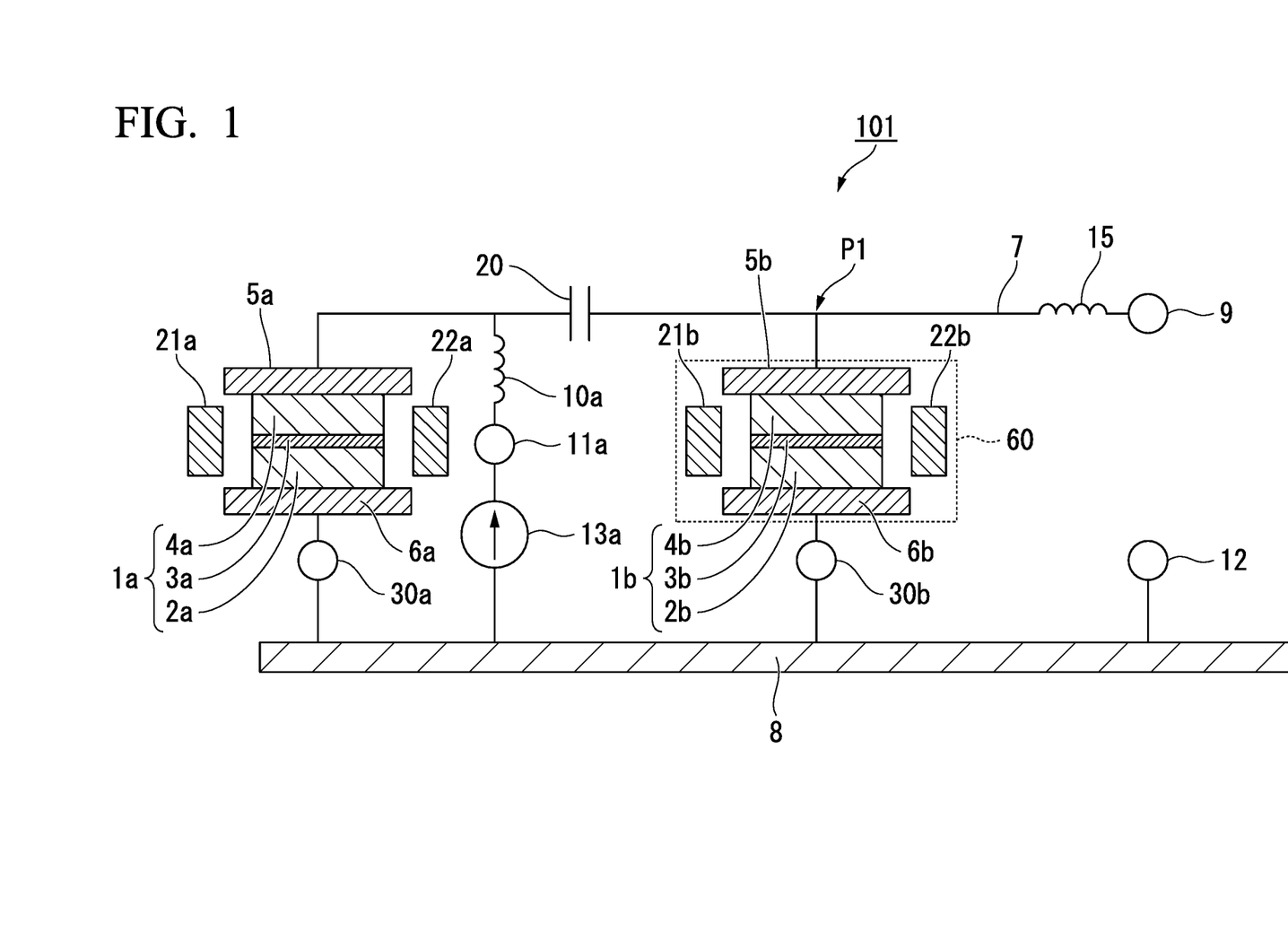
FIG. 1 is a schematic cross-sectional diagram illustrating the configuration of a magnetic field sensor according to a first embodiment of the present disclosure.

FIG. 1 is a schematic cross-sectional diagram of a magnetic field sensor 101 according to a first embodiment of the present disclosure.

The magnetic field sensor 101 includes: a magnetoresistance effect element 1a; a magnetoresistance effect element 1b; an upper electrode 5a and a lower electrode 6a corresponding to the magnetoresistance effect element 1a; an upper electrode 5b and a lower electrode 6b corresponding to the magnetoresistance effect element 1b; an output port 9; a ground port 12; a signal line 7; an inductor 10a; a capacitor 20; an input terminal 11a; a power supply 13a; an inductor 15; bias magnetic field applying units 21a, 21b, 22a, and 22b; a ground 8; and reference electric potential terminals 30a and 30b.

The magnetoresistance effect element 1a includes a magnetization fixed layer 2a and a magnetization free layer 4a with a spacer layer 3a disposed therebetween. Similarly, the magnetoresistance effect element 1b includes a magnetization fixed layer 2b and a magnetization free layer 4b with a spacer layer 3b disposed therebetween.

Here, although a case in which the magnetic field sensor 101 includes all the constituent elements illustrated in FIG. 1 will be described in this embodiment, a configuration in which the magnetic field sensor 101 does not include some of the constituent elements illustrated in FIG. 1 may be used as another example.

For example, the magnetic field sensor 101 may not include the power supply 13a, and in such a case, a power supply disposed outside the magnetic field sensor 101 may be used as the power supply 13a.

In addition, the magnetic field sensor 101 may, for example, not include the ground 8 and the ground port 12, and in such a case, a ground and a ground port disposed outside the magnetic field sensor 101 may be used as the ground 8 and the ground port 12.

As an example, the magnetic field sensor 101 may be configured to include a circuit part disposed between the reference electric potential terminal 30a, the reference electric potential terminal 30b, the input terminal 11a, and the output port 9 illustrated in HG 1, and in such a case, the power supply 13a, the ground 8, and the ground port 12 can be regarded as being disposed outside the magnetic field sensor 101.

The magnetoresistance effect element 1a and the magnetoresistance effect element 1b, as illustrated in FIG. 1, are connected to the signal line 7. The magnetoresistance effect element 1a and the magnetoresistance effect element 1b are respectively connected to the reference electric potential terminals 30a and 30b and can be connected to the ground 8 respectively through the reference electric potential terminals 30a and 30b. More specifically, each of the magnetoresistance effect element 1a and the magnetoresistance effect element 1b has one end (an end on the side of the magnetization free layer 4a or the magnetization free layer 4b) connected to the signal line 7 and the other end (an end on the side of the magnetization fixed layer 2a or 2b) connected to the ground 8 through the reference electric potential terminal 30a or 30b. A direction in which the magnetoresistance effect element 1a and the magnetoresistance effect element 1b are connected is not limited thereto, and the magnetoresistance effect element 1a may have one end (the end on the side of the magnetization free layer 4a) connected to the ground 8 through the reference electric potential terminal 30a and the other end (the end on the side of the magnetization fixed layer 2a) connected to the signal line 7.

Similarly, the magnetoresistance effect element 1b may have one end (the end on the side of the magnetization free layer 4b) connected to the ground 8 through the reference electric potential terminal 30b and the other end (the end on the side of the magnetization fixed layer 2b) connected to the signal line 7.

The inductor 10a is disposed at a position at which the magnetoresistance effect element 1a and the magnetoresistance effect element 1b are in parallel with respect to the output port 9 and is connected between the magnetoresistance effect element 1a and the magnetoresistance effect element 1b in the signal line 7. The input terminal 11a is connected to the magnetoresistance effect element 1a in series. More specifically, as illustrated in FIG. 1, the input terminal 11a is connected between the inductor 10a and the ground 8. In other words, the input terminal 11a is connected to the signal line 7 through the inductor 10a at a position at which the magnetoresistance effect element 1a and the magnetoresistance effect element 1b are in parallel with respect to the output port 9. The input terminal 11a is connected to the magnetoresistance effect element 1a and the inductor 10a in series. By connecting the power supply 13a between the input terminal 11a and the ground 8, the magnetic field sensor 101 can form a closed circuit including the magnetoresistance effect element 1a, part of the signal line 7, the input terminal 11a, and part of the ground 8. The capacitor 20 is connected to the signal line 7 in series between a connection portion of the inductor 10a and the signal line 7 and the magnetoresistance effect element 1b. In other words, in this embodiment, the capacitor 20 is connected between the input terminal 11a and the magnetoresistance effect element 1b and is connected between the input terminal 11a and the output port 9. The capacitor 20 has a role of causing an invariable component of a current from the power supply 13a not to flow through the magnetoresistance effect element 1b and the output port 9 other than the magnetoresistance effect element 1a.

The upper electrode 5a and the lower electrode 6a have a role as one pair of electrodes and are disposed in a stacking direction of layers (the magnetization free layer 4a, the spacer layer 3a, and the magnetization fixed layer 2a) configuring the magnetoresistance effect element 1a through the magnetoresistance effect element 1a.

Similarly, the upper electrode 5b and the lower electrode 6b have a role as one pair of electrodes and are disposed in a stacking direction of layers (the magnetization free layer 4b, the spacer layer 3b, and the magnetization fixed layer 2b) configuring the magnetoresistance effect element 1b through the magnetoresistance effect element 1b.

In other words, the upper electrodes 5a and 5b and the lower electrodes 6a and 6b have functions as one pair of electrodes used for causing currents to flow through the magnetoresistance effect elements 1a and 1b in directions intersecting with faces of the layers configuring the magnetoresistance effect elements 1a and 1b, for example, directions (stacking directions) perpendicular to faces of the layers configuring the magnetoresistance effect elements 1a and 1b. Here, in this embodiment, a DC current flows through the magnetoresistance effect element 1a, and a high-frequency current flows through the magnetoresistance effect element 1b.

The upper electrodes 5a and 5b and the lower electrodes 6a and 6b, for example, are preferably configured using films of Ta, Cu, Au, AuCu, or Ru or any two of these materials.

The ground 8 functions as a reference electric potential. The shapes of the signal line 7 and the ground 8, for example, are preferably defined to be a micro strip line (MSL) type or a coplanar waveguide (CPW) type. When the micro strip line shape or the coplanar waveguide shape is designed, a signal line width of the signal line 7 and a distance thereof to the ground are designed such that the characteristic impedance of the signal line 7 and the impedance of a circuit system are the same, whereby the signal line 7 can be configured as a transmission line having a low transmission loss. The signal line 7, for example, is preferably configured using a material having high electrical conductivity such as Au, Cu, AuCu, Ag, or Al.

The inductor 10a has a function of cutting off a high-frequency component of a current using an inductor component and allowing an invariable component of the current to flow through it. The inductor 10a, for example, may be a chip inductor or an inductor according to a pattern line. In addition, as another example, the inductor 10a may be a resistance element having an inductor component. The inductance value of the inductor 10a may be arbitrary and, for example, is preferably 10 [nH] or more. The inductor 10a prevents a high-frequency signal output from the magnetoresistance effect element 1a from flowing into the input terminal 11a and effectively applies the high-frequency signal output from the magnetoresistance effect element 1a to the magnetoresistance effect element 1b. An invariable component of a current input from the input terminal 11a flows through a closed circuit formed to include the magnetoresistance effect element 1a, part of the signal line 7, the inductor 10a, the input terminal 11a, and part of the ground 8. By using this closed circuit, a DC current or a DC voltage can be effectively applied to the magnetoresistance effect element 1a.

The input terminal 11a is connected between the inductor 10a and the ground 8. By connecting the power supply 13a between the input terminal 11a and the ground 8, a DC current or a DC voltage can be applied to the magnetoresistance effect element 1a.

The power supply 13a is connected between the input terminal 11a and the ground 8. In accordance with the power supply 13a, a DC current or a DC voltage is applied from the input terminal 11a to the magnetoresistance effect element 1a.

The power supply 13a may be a DC current source or a DC voltage source. The power supply 13a may be a DC current source that can generate a constant DC current or a DC voltage source that can generate a constant DC voltage. In addition, the power supply 13a may be a DC current source in which the magnitude of a generated DC current value can be changed or a DC voltage source in which the magnitude of the generated DC voltage value can be changed.

The inductor 15 is connected to a portion of the signal line 7 between the magnetoresistance effect element 1b and the output port 9 that is not between the two magnetoresistance effect elements 1a and 1b. In other words, as illustrated in FIG. 1, at a point (branch point P1) of the signal line 7 branching in parallel into the magnetoresistance effect element 1b and the output port 9, the inductor 15 is included between the branch point P1 and the output port 9. In addition, in the signal line 7, the inductor 15 and the output port 9 are connected in series.

By employing this configuration, the inductor 15 performs an action of causing a high-frequency signal not to flow to the output port 9. In this way, application of a high-frequency signal generated from the magnetoresistance effect element 1a to the magnetoresistance effect element 1b through the signal line 7 can be realized.

Here, the inductor 15, for example, may be a chip inductor or an inductor according to a pattern line. In addition, as another example, the inductor 15 may be a resistance element having an inductor component. The inductance value of the inductor 15 may be arbitrary and, for example, is preferably 10 [nH] or more.

The bias magnetic field applying units 21a, 22a, 21b, and 22b are disposed near the magnetoresistance effect element 1a and the magnetoresistance effect element 1b and apply static magnetic fields to the magnetoresistance effect element 1a and the magnetoresistance effect element 1b. For example, each of the bias magnetic field applying units 21a, 22a, 21b, and 22b is configured using a permanent magnet that applies a constant magnetic field. As another example, each of the bias magnetic field applying units 21a, 22a, 21b, and 22b may be configured using an electromagnet.

In this embodiment, a static magnetic field is applied to the magnetoresistance effect element 1a using the bias magnetic field applying units 21a and 22a, and a static magnetic field is applied to the magnetoresistance effect element 1b using the bias magnetic field applying units 21b and 22b. Here, the direction of the static magnetic field (first bias magnetic field) applied to the magnetoresistance effect element 1a by the bias magnetic field applying units 21a and 22a and the direction of the static magnetic field (second bias magnetic field) applied to the magnetoresistance effect element 1b using the bias magnetic field applying units 21b and 22b may be either the same direction or different directions.

As one example, the direction of the first bias magnetic field and a direction of a magnetic field of the detection target (external magnetic field) may coincide with each other. As another example, the direction of the first bias magnetic field and the direction of a magnetic field of the detection target (external magnetic field) may be opposite directions.

Each of the magnetization fixed layers 2a and 2b is configured using a ferromagnetic material, and the magnetization direction thereof is substantially fixed to one direction. Each of the magnetization fixed layers 2a and 2b, for example, is preferably configured from a high spin polarizability material such as Fe, Co, Ni, an alloy of Ni and Fe, an alloy of Fe and Co, or an alloy of Fe, Co, and B. Accordingly, a high magnetoresistance change rate can be acquired. In addition, each of the magnetization fixed layers 2a and 2b may be configured using a Heusler alloy. Here, the film thickness of each of the magnetization fixed layers 2a and 2b, for example, is preferably 1 to 10 [nm]. In addition, in the magnetization fixed layers 2a and 2b, in order to fix the magnetization of the magnetization fixed layers 2a and 2b, an antiferromagnetic layer may be added to be in contact with the magnetization fixed layers 2a and 2b. As another example, in the magnetization fixed layers 2a and 2b, the magnetization of the magnetization fixed layers 2a and 2b may be fixed using magnetic anisotropy due to a crystal structure, a shape, or the like. As the material of the antiferromagnetic layer, for example, FeO, CoO, NiO, $CuFeS_2$, IrMn, FeMn, PtMn, Cr, Mn, or the like may be used.

The spacer layers 3a and 3b are respectively disposed between the magnetization fixed layers 2a and 2b and the magnetization free layers 4a and 4b. The magnetization of the magnetization fixed layers 2a and 2b and the magnetization of the magnetization free layers 4a and 4b interact with each other, whereby a magnetoresistance effect is acquired. Each of the spacer layers 3a and 3b, for example, is configured of a layer composed using a conductive body, an insulator, or semiconductor or a layer including an electric conduction point configured using a conductor in an insulator.

For example, in a case in which a nonmagnetic conductive material is applied as each of the spacer layers 3a and 3b, Cu, Ag, Au, Ru, or the like may be used as the material, and a giant magnetoresistance (GMR) effect is exhibited in each of the magnetoresistance effect elements 1a and 1b. In a case in which the GMR effect is used, the film thickness of each of the spacer layers 3a and 3b, for example, is preferably about 0.5 to 3.0 [nm].

For example, in a case in which a nonmagnetic insulating material is applied as each of the spacer layers 3a and 3b, $Al_2O_3$, MgO, or the like may be used as the material, and a tunnel magnetoresistance (TMR) effect is exhibited in each of the magnetoresistance effect elements 1a and 1b. In this case, in each of the magnetoresistance effect elements 1a and 1b, a high magnetoresistance change rate is acquired by adjusting the film thicknesses of the spacer layers 3a and 3b such that coherent tunnel effects are exhibited between the magnetization fixed layers 2a and 2b and the magnetization free layers 4a and 4b. In a case in which the TMR effect is used, the film thickness of each of the spacer layers 3a and 3b, for example, is preferably about 0.5 to 3.0 [nm].

For example, in a case in which a nonmagnetic semiconductor material is applied as each of the spacer layers 3a and 3b, ZnO, $In_2O_3$, $SnO_2$, ITO, $GaO_x$, $Ga_2O_x$, or the like may be used as the material. In this case, the film thickness of each of the spacer layers 3a and 3b, for example, is preferably about 1.0 to 4.0 [nm].

For example, in a case in which a layer including an electric conduction point configured using a conductor in a nonmagnetic insulator is applied as each of the spacer layers 3a and 3b, a structure is preferable which includes an electric conduction point configured using a conductor such as CoFe, CoFeB, CoFeSi, CoMnGe, CoMnSi, CoMnAl, Fe, Co, Au, Cu, Al, or Mg in a nonmagnetic insulator configured using $Al_2O_3$ or MgO. In this case, the film thickness of each of the spacer layers 3a and 3b, for example, is preferably about 0.5 to 2.0 [nm].

Each of the magnetization free layers 4a and 4b has a direction of magnetization that can be changed in accordance with an externally applied magnetic field or spin-polarized electrons and is configured of a ferromagnetic material. Each of the magnetization free layers 4a and 4b, for example, in the case of being configured from a material having an axis of easy magnetization in a film face-inner direction, may have CoFe, CoFeB, CoFeSi, CoMnGe, CoMnSi, CoMnAl, or the like as its material, and the thickness thereof is preferably about 1 to 30 [nm]. In addition, each of the magnetization free layers 4a and 4b, in the case of being configured from a material having an axis of easy magnetization in the direction of a normal line of the film face, may use Co, a CoCr-based alloy, a Co multilayer, a CoCrPt-based alloy, a FePt-based alloy, a SmCo-based alloy or a TbFeCo alloy containing a rare earth element, or the like as its material. In addition, each of the magnetization free layers 4a and 4b, for example, may be configured of a Heusler alloy.

In addition, for each of the magnetization free layers 4a and 4b, high-spin polarization materials may be inserted between the magnetization free layers 4a and 4b and the spacer layers 3a and 3b. In such a case, a high magnetoresistance change rate can be acquired. As the high spin polarizability material, for example, a CoFe alloy, a CoFeB alloy, or the like may be used. Also for any one of the CoFe alloy and the CoFeB alloy, the film thickness, for example, is preferably about 0.2 to 1.0 [nm].

In addition, while a configuration in which the magnetization fixed layers 2a and 2b and the magnetization free layers 4a and 4b are disposed on both sides of the spacer layers 3a and 3b in the magnetoresistance effect elements 1a and 1b has been illustrated in this embodiment, as another example, magnetization free layers may be used instead of the magnetization fixed layers 2a and 2b. In other words, a magnetoresistance effect element in which magnetization free layers are disposed on both sides of the spacer layer may be used.

Here, in the magnetoresistance effect elements 1a and 1b, cap layers, seed layers, or buffer layers may be disposed between the upper electrodes 5a and 5b and magnetoresistance effect elements 1a and 1b and between the lower electrodes 6a and 6b and the magnetoresistance effect elements 1a and 1b. As the cap layers, the seed layers, or the buffer layers, for example, Ru, Ta, Cu, Cr or laminated films thereof may be used, and the film thicknesses of such layers, for example, are preferably about 2 to 10 [nm].

The sizes of the magnetoresistance effect elements 1a and 1b may be arbitrary. For example, long sides of the magnetoresistance effect elements 1a and 1b are preferably about 100 [nm] or 100 [nm] or less. Here, in a case in which the planar shapes of the magnetoresistance effect elements 1a and 1b are not rectangles (including squares), long sides of the rectangles circumscribing the planar shapes of the magnetoresistance effect elements 1a and 1b with minimal areas are defined as the long sides of the magnetoresistance effect elements 1a and 1b. In a case in which these long sides are small at about 100 [nm], single magnetic domain formation of the magnetization free layers 4a and 4b can be achieved, and a high-efficient spin torque resonance effect can be realized. Here, the "planar shapes" are shapes acquired by viewing the magnetoresistance effect elements 1a and 1b in a plane perpendicular to a stacking direction of the layers of each of the magnetoresistance effect elements 1a and 1b.

Here, the spin torque oscillation effect will be described. When balance between the intensity of a magnetic field applied to a magnetoresistance effect element and the magnitude of a DC current flowing through the magnetoresistance effect element is under a predetermined condition, magnetization of a free magnetization layer oscillates (precession occurs). The resistance value of the magnetoresistance effect element is determined in accordance with a relative angle between the magnetization of a magnetization fixed layer and the magnetization of a magnetization free layer. For this reason, the resistance value of the magnetoresistance effect element periodically changes in accordance with the oscillation of the magnetization of the magnetization free layer. In other words, the magnetoresistance effect element can be handled as a resistance oscillation element of which a resistance value periodically changes at a frequency at which the magnetization oscillates. At this time, when a DC current flows through the magnetoresistance effect element, a high-frequency signal of the frequency at which the magnetization oscillates can be output from the magnetoresistance effect element. In other words, the magnetoresistance effect element functions as an oscillator. This effect is called a spin torque oscillation effect. A spin torque oscillation frequency that is the frequency of this oscillation (the frequency of the precession) changes in accordance with the intensity of a magnetic field applied to the magnetoresistance effect element.

In addition, when a high-frequency signal is input to the magnetoresistance effect element, the magnetoresistance effect element outputs a DC voltage in accordance with the spin torque resonance phenomenon. In other words, the magnetoresistance effect element functions as a diode (rectifier). This effect is called a spin torque diode effect. When the frequency of the input high-frequency signal coincides with the spin torque resonance frequency of the magnetoresistance effect element, a highest DC voltage is output.

In this embodiment, the spin torque oscillation frequency of the magnetoresistance effect element 1a changes in accordance with an effective magnetic field of the magnetization free layer 4a. The effective magnetic field $H_{eff}$ of the magnetization free layer 4a can be represented by Equation (1) using a magnetic field $H_E$ applied to the magnetization free layer 4a, an anisotropic magnetic field $H_k$ of the magnetization free layer 4a, an anti-magnetic field H_D of the magnetization free layer 4a, and an exchange coupling magnetic field H_{EX} of the magnetization free layer 4a.

In addition, this similarly applies to the spin torque resonance frequency of the magnetoresistance effect element 1b.

$$H_{eff} = H_E + H_k + H_D + H_{EX} \quad (1)$$

Next, the operation principle of the magnetic field sensor 101 will be described.

When a DC current flows through the magnetoresistance effect element 1a in accordance with application of a DC current or a DC voltage from the input terminal 11a, the magnetoresistance effect element 1a can generate a high-frequency signal of a spin torque oscillation frequency in accordance with the spin torque oscillation effect. In this state, when a detected external magnetic field is applied to the magnetoresistance effect element 1a, the spin torque oscillation frequency of the magnetoresistance effect element 1a changes, and accordingly, the frequency of a high-frequency signal output from the magnetoresistance effect element 1a changes. In other words, a change in the external magnetic field can be taken out as a change in the frequency. In addition, the high-frequency signal generated from the magnetoresistance effect element 1a is applied to the magnetoresistance effect element 1b through the signal line 7.

At this time, it is possible to output a DC voltage to the output port 9 from the magnetoresistance effect element 1b in accordance with the spin torque diode effect. When the frequency of a high-frequency signal input to the magnetoresistance effect element 1b coincides with the spin torque resonance frequency of the magnetoresistance effect element 1b, the magnetoresistance effect element 1b outputs the highest DC voltage in accordance with the spin torque diode effect. In addition, as a difference between the frequency of the input high-frequency signal and the spin torque resonance frequency of the magnetoresistance effect element 1b increases, the output voltage gradually decreases. In a case in which the spin torque resonance frequency of the magnetoresistance effect element 1b is fixed, when the spin torque oscillation frequency of the magnetoresistance effect element 1a changes in accordance with a change in the detected external magnetic field, the magnitude of the DC voltage output from the magnetoresistance effect element 1b changes. In other words, the magnetic field sensor 101 can detect the amount of change in the external magnetic field as the amount of change in the output voltage.

In this embodiment, the output port 9 is connected to the signal line 7, the ground port 12 is connected to the ground 8, and a voltmeter (not illustrated in the drawing) is connected between the output port 9 and the ground port 12. In this way, the voltmeter and the magnetoresistance effect element 1b are connected in parallel, and the magnitude of a DC voltage output from the magnetoresistance effect element 1b is detected (measured) using the voltmeter. On the basis of the magnitude of the DC voltage, the magnitude of the external magnetic field can be detected.

Although the inductor 15 is included between the branch point P1 of the signal line 7 and the output port 9 in this embodiment, as another example, in a case in which the voltmeter (disposed outside the magnetic field sensor 101) connected to the output port 9 includes an inductor, the inductor 15 may not be included.

Similarly, although the inductor 10a is included between the signal line 7, which is disposed between the magnetoresistance effect elements 1a and 1b, and the input terminal 11a in this embodiment, as another example, in a case in which the power supply 13a includes an inductor, the inductor 10a may not be included.

In addition, the output port 9 may be included in an arbitrary place at which a DC voltage output from the magnetoresistance effect element 1b can be detected and, for example, may be connected not to the signal line 7 but to the upper electrode 5b of the magnetoresistance effect element 1b.

Figure 2:
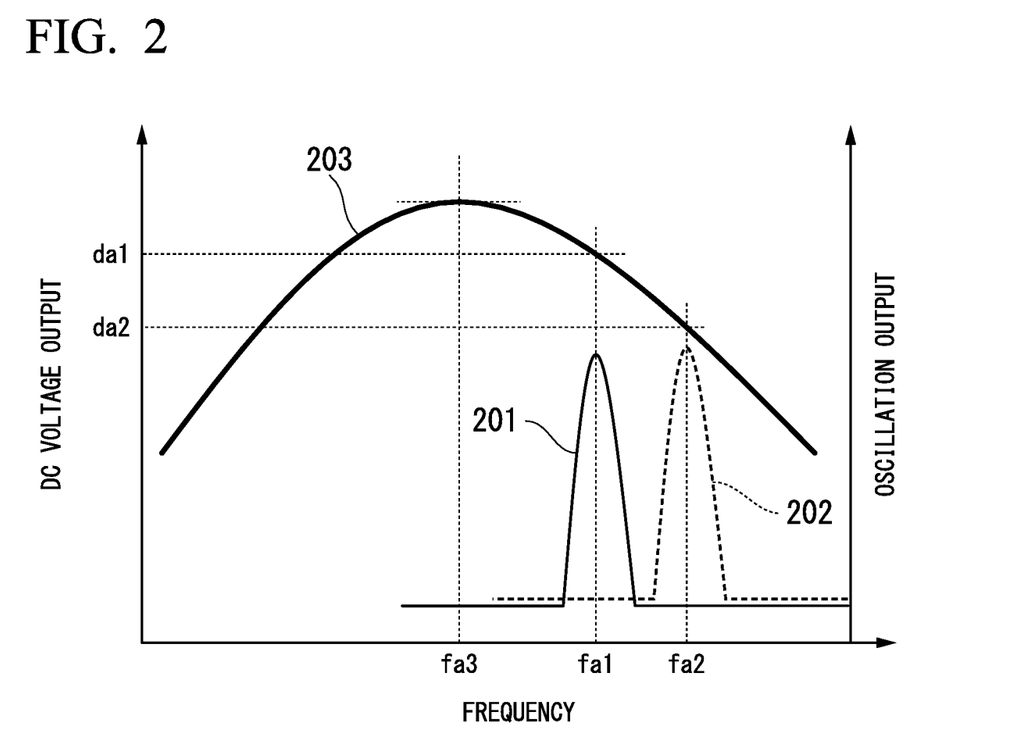
FIG. 2 is a diagram illustrating a graph representing spin torque oscillation and a relation between the frequency of spin torque resonance and a DC voltage output and an oscillation output according to the first embodiment of the present disclosure.

FIG. 2 is a diagram illustrating a graph representing spin torque oscillation and a relationship between the frequency of spin torque resonance and a DC voltage output and an oscillation output according to the first embodiment of the present disclosure.

In the graph illustrated in FIG. 2, a vertical axis on the left side represents a DC voltage output from the magnetoresistance effect element 1b, a vertical axis on the right side represents an oscillation output from the magnetoresistance effect element 1a, and the horizontal axis represents the frequency. For the convenience of descriptions, an example of a graph under a condition where the intensity of the external magnetic field of the detection target applied to the magnetoresistance effect element 1a changes, is shown in FIG. 2, in the case where: the spin torque resonance frequency of the magnetoresistance effect element 1b is constant (in other words, a case in which an external magnetic field of the detection target is not applied to the magnetoresistance effect element 1b, and the intensity of a magnetic field applied to the magnetoresistance effect element 1b is constant); and the direction of a static magnetic field applied to the magnetoresistance effect element 1a by the bias magnetic field applying units 21a and 22a and the direction of the external magnetic field of the detection target match.

In the example illustrated in FIG. 2, a plot line of a characteristic 201 is a characteristic acquired when the intensity of the external magnetic field of the detection target, applied from the outside to the magnetoresistance effect element 1a is Ba1, and a plot line of a characteristic 202 is a characteristic acquired when the intensity of the external magnetic field of the detection target, applied from the outside to the magnetoresistance effect element 1a is Ba2. The relation between the intensities of such external magnetic fields is Ba1<Ba2.

In the example illustrated in FIG. 2, a plot line of a characteristic 203 represents the magnitude of an output DC voltage according to the spin torque diode effect of the magnetoresistance effect element 1b with respect to the frequency of an input high-frequency signal.

As illustrated in FIG. 2, in a case in which the intensity of an external magnetic field applied from the outside to the magnetoresistance effect element 1a changes (shifts) from Ba1 to Ba2, the frequency of a high-frequency signal output from the magnetoresistance effect element 1a changes (shifts) from fa1 to fa2 (which is higher than fa1) as the intensity of the magnetic field applied to the magnetoresistance effect element 1a increases.

In addition, since the spin torque resonance frequency fa3 of the magnetoresistance effect element 1b is constant, a DC voltage output from the magnetoresistance effect element 1b changes (shifts) from da1 to da2, which is lower than da1, in accordance with the frequency of the high-frequency signal output from the magnetoresistance effect element 1a. In other words, the magnetic field sensor 101 functions as a magnetic field sensor that can detect a change in the external magnetic field as a change in the output voltage. The spin torque oscillation frequency of the magnetoresistance effect element 1a is sensitive to the intensity of the magnetic field applied from the outside, and accordingly, the detection sensitivity of the magnetic field sensor 101 is high. Accordingly, the magnetic field sensor 101 is appropriate for detection of a minute magnetic field. In this embodiment, by detecting a minute magnetic field as an external magnetic field, magnetic fields (a first bias magnetic field and a second bias magnetic field) applied by the bias magnetic field applying units 21a, 21b, 22a, and 22b are stronger than the external magnetic field of the detection target.

In addition, in order to improve the sensitivity of the magnetic field sensor 101, the direction of magnetization of the magnetization fixed layer 2a of the magnetoresistance effect element 1a is preferably oriented in the same direction as the external magnetic field of the detection target. In this direction, the amplitude (level) of oscillation from the magnetoresistance effect element 1a becomes large.

In addition, in the magnetic field sensor 101, in order to prevent an external magnetic field of the detection target, from being applied to the magnetoresistance effect element 1b, for example, it is preferable to dispose a magnetic shield 60 on a periphery of the magnetoresistance effect element 1b for being used as a magnetic field sensor. However, the magnetic shield 60 may not be disposed on a periphery of the magnetoresistance effect element 1b.

In this embodiment, while the magnetoresistance effect elements 1a and 1b have similar structural configurations, the magnetoresistance effect elements 1a and 1b are configured not to perform the exact same operation but different operations. The magnetoresistance effect elements 1a and 1b preferably have optimized configurations according to the functions thereof.

As described above, the magnetic field sensor 101 according to this embodiment includes: the magnetoresistance effect element 1a (first magnetoresistance effect element); the magnetoresistance effect element 1b (second magnetoresistance effect element); the output port 9; the signal line 7; and the input terminal 11a (first input terminal) configured to be capable of applying a DC current or a DC voltage to the magnetoresistance effect element 1a. The magnetoresistance effect elements 1a and 1b each include: the magnetization fixed layers 2a and 2b (first magnetic layer); the magnetization free layers 4a and 4b (second magnetic layer); and the spacer layers 3a and 3b interposed therebetween. The magnetoresistance effect element 1a and the magnetoresistance effect element 1b are connected through the signal line 7. The output port 9 is connected to the magnetoresistance effect element 1b in parallel. The output port 9 can output a DC output voltage from the magnetoresistance effect element 1b.

Accordingly, the magnetic field sensor 101 according to this embodiment can be configured to have a simple configuration.

Here, the magnetic field sensor 101 according to this embodiment can provide a magnetic field sensors using the magnetoresistance effect elements 1a and 1b and detects a magnetic field using the spin torque oscillation function of the magnetoresistance effect element 1a and the spin torque diode function of the magnetoresistance effect element 1b.

The magnetic field sensor 101 according to this embodiment further includes the capacitor 20. The capacitor 20 is connected between the input terminal 11a and at least one of the magnetoresistance effect element 1b and the output port 9. While the capacitor 20 is connected between the input terminal 11a and the magnetoresistance effect element 1b and is connected between the input terminal 11a and the output port 9 in this embodiment, as another configuration example, the capacitor 20 may be connected on one side thereof.

Accordingly, in the magnetic field sensor 101 according to this embodiment, an invariable component of a current from the power supply 13a can be suppressed from flowing to the magnetoresistance effect element 1b rather than the magnetoresistance effect element 1a and the output port 9 using the capacitor 20.

In a case in which there is no problem even when the invariable component of the current from the power supply 13a flows to the magnetoresistance effect element 1b rather than the magnetoresistance effect element 1a and the output port 9, the capacitor 20 may not be included.

In the magnetic field sensor 101 according to this embodiment, the bias magnetic field applying units 21a, 22a, 21b, and 22b applying a bias magnetic field (first bias magnetic field) to the magnetoresistance effect element 1a and applying a bias magnetic field (second bias magnetic field) to the magnetoresistance effect element 1b are included.

The first bias magnetic field and the second bias magnetic field, for example, may be magnetic fields of the same direction or may have components of opposite directions.

In addition, in a case in which the first bias magnetic field is applied to the magnetoresistance effect element 1a and the second bias magnetic field is applied to the magnetoresistance effect element 1b, the spin torque oscillation effect of the magnetoresistance effect element 1a and the spin torque diode effect of the magnetoresistance effect element 1b may easily occur. However, in a case in which such effects occur also in a case in which the bias magnetic fields are not applied, the bias magnetic field applying units 21a, 22a, 21b, and 22b may not be included.

In the magnetic field sensor 101 according to this embodiment, the magnetoresistance effect element 1a and the magnetoresistance effect element 1b are connected in parallel with respect to the output port 9. In addition, the magnetoresistance effect elements 1a and 1b can be connected in parallel with respect to the ground 8 through the reference electric potential terminals 30a and 30b. In other words, when the magnetic field sensor 101 is connected to the ground 8 disposed outside the magnetic field sensor 101, the magnetoresistance effect element 1a and the magnetoresistance effect element 1b are connected in parallel with respect to the ground 8.

In addition, the magnetic field sensor 101 according to this embodiment may also be applied to an arbitrary device or the like and, for example, may be used for detection of a biological magnetic field by using the advantage of being appropriate for detection of a minute magnetic field.

Second Embodiment

Figure 3:
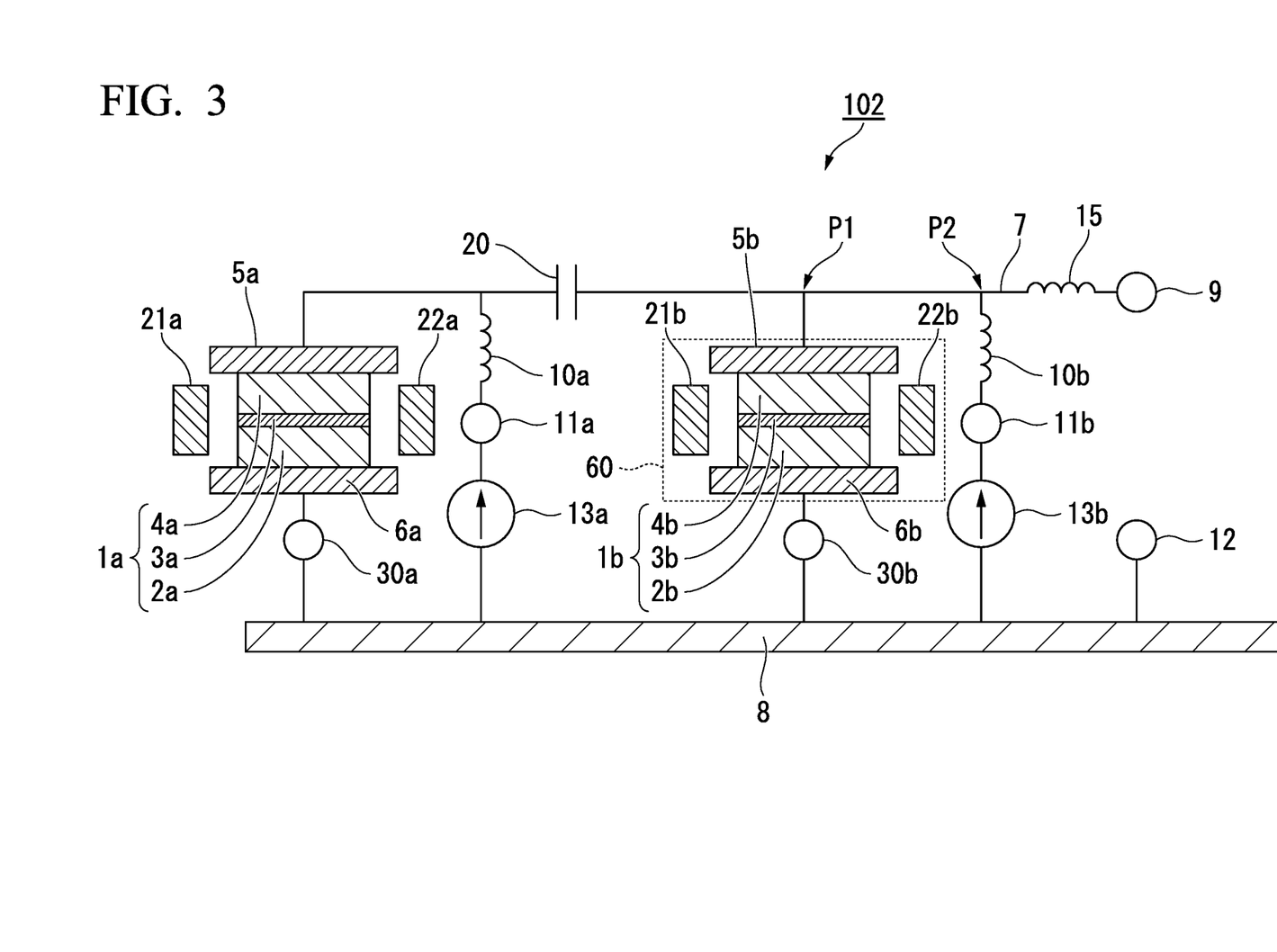
FIG. 3 is a schematic cross-sectional diagram illustrating the configuration of a magnetic field sensor according to a second embodiment of the present disclosure.

FIG. 3 is a schematic cross-sectional diagram illustrating the configuration of a magnetic field sensor 102 according to a second embodiment of the present disclosure.

In the magnetic field sensor 102, features different from those of the magnetic field sensor 101 according to the first embodiment will mainly be described, and items common to the first embodiment will not be described. In addition, the same reference numeral is assigned to each constituent element that is common to that of the magnetic field sensor 101 according to the first embodiment, and description thereof will not be presented.

The magnetic field sensor 102 according to this embodiment includes the constituent elements of the magnetic field sensor 101 according to the first embodiment and further includes an inductor 10b, an input terminal 11b, and a power supply 13b. The inductor 10b is connected between a magnetoresistance effect element 1b and an output port 9 in a signal line 7 at a position that is in parallel with the magnetoresistance effect element 1b with respect to the output port 9. The input terminal 11b is connected in series to the magnetoresistance effect element 1b. More specifically, as illustrated in FIG. 3, the input terminal 11b is connected between the inductor 10b and a ground 8. In other words, the input terminal 11b is connected to the signal line 7 through the inductor 10b at a position in parallel with the magnetoresistance effect element 1b with respect to the output port 9. The input terminal 11b is connected in series with the magnetoresistance effect element 1b and the inductor 10b. By connecting a power supply 13b to the input terminal 11b and the ground 8, in the magnetic field sensor 102, a closed circuit including the magnetoresistance effect element 1b, part of the signal line 7, the input terminal 11b, and part of the ground 8 can be formed.

In the example illustrated in FIG. 3, for a point (branch point P2) branching parallel into the inductor 10b and the output port 9 in the signal line 7, an inductor 15 is disposed to be included between the branch point P2 and the output port 9. As another example, the inductor 15 may be included between a branch point P1 and the branch point P2, and, in such a case, when the inductor 15 achieves the role of the inductor 10b, the inductor 10b may not be included.

Here, in this embodiment although a case in which the magnetic field sensor 102 includes all the constituent elements illustrated in FIG. 3 is described, as another example, a configuration of the magnetic field sensor 102 not including some of the constituent elements illustrated in FIG. 3 may be used.

For example, the magnetic field sensor 102 may not include a power supply 13a. In such a case, a power supply disposed outside the magnetic field sensor 102 is used as the power supply 13a.

For example, the magnetic field sensor 102 may not include the power supply 13b. In such a case, as the power supply 13b, a power supply disposed outside the magnetic field sensor 102 is used.

In addition, for example, the magnetic field sensor 102 may not include the ground 8 and a ground port 12. In such a case, as the ground 8 and the ground port 12, a ground and a ground port disposed outside the magnetic field sensor 101 are used.

As an example, the magnetic field sensor 102 may be configured to include a circuit part between a reference electric potential terminals 30a, a reference electric potential terminals 30b, an input terminal 11a, and an input terminal 11b and the output port 9 illustrated in FIG. 3. In such a case, the power supply 13a, the power supply 13b, the ground 8, and the ground port 12 are regarded as being disposed outside the magnetic field sensor 102.

In the magnetic field sensor 102, when the spin torque diode effect of the magnetoresistance effect element 1b is acquired, a DC current or a DC voltage can be applied to the magnetoresistance effect element 1b. When a DC current or a DC voltage is applied to the magnetoresistance effect element 1b, the diode sensitivity is improved, and accordingly, a DC voltage output from the magnetoresistance effect element 1b becomes high. In other words, the magnetic field sensor 102 can function as a magnetic field sensor having an output higher than that of the case of the first embodiment.

In addition, in this embodiment, the current density of a current flowing from the power supply 13a to the magnetoresistance effect element 1a is higher than the current density of a current flowing from the power supply 13b to the magnetoresistance effect element 1b. In this embodiment, a current having a high current density required for spin torque oscillation is caused to flow through the magnetoresistance effect element 1a, and a current having a low current density of a degree for which a spin torque oscillation effect is not exhibited in the magnetoresistance effect element 1b is caused to flow through the magnetoresistance effect element 1b as a bias.

In this embodiment, although the inductor 10b is included between the signal line 7, which is disposed between the magnetoresistance effect element 1b and the output port 9, and the input terminal 11b, as another example, in a case in which the power supply 13b includes an inductor, the inductor 10b may not be included.

As above, similar to the case of the first embodiment, the magnetic field sensor 102 according to this embodiment may have a simple configuration.

In addition, the magnetic field sensor 102 according to this embodiment may further include the input terminal 11b (second input terminal) configured to be capable of applying a DC current or a DC voltage to the magnetoresistance effect element 1b (second magnetoresistance effect element).

Therefore, the magnetic field sensor 102 according to this embodiment can improve the diode sensitivity of the magnetoresistance effect element 1b, and accordingly, the output can be improved.

Third Embodiment

Figure 4:
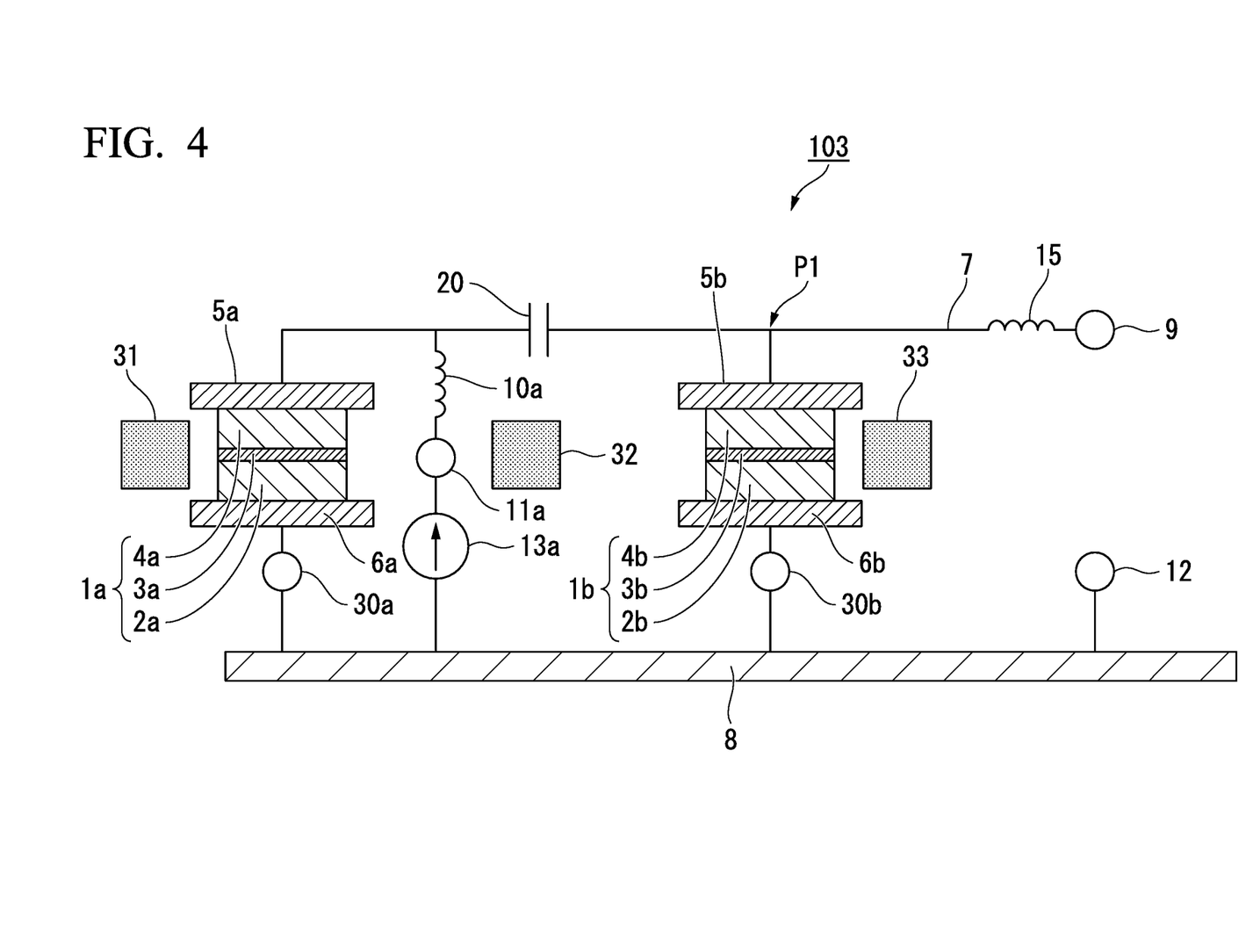
FIG. 4 is a schematic cross-sectional diagram illustrating the configuration of a magnetic field sensor according to a third embodiment of the present disclosure.

FIG. 4 is a schematic cross-sectional diagram illustrating the configuration of a magnetic field sensor 103 according to a third embodiment of the present disclosure.

In the magnetic field sensor 103, features different from those of the magnetic field sensor 101 according to the first embodiment will mainly be described, and items common to the first embodiment will not be described. In addition, the same reference numeral is assigned to each constituent element that is common to that of the magnetic field sensor 101 according to the first embodiment, and description thereof will not be presented.

The magnetic field sensor 103 according to this embodiment includes the constituent elements of the magnetic field sensor 101 according to the first embodiment and further includes bias magnetic field applying units 31 to 33 instead of the bias magnetic field applying units 21a, 22a, 21b, and 22b. The bias magnetic field applying units 31 to 33 are disposed near a magnetoresistance effect element 1a and a magnetoresistance effect element 1b and apply constant magnetic fields of opposite directions to the magnetoresistance effect element 1a and the magnetoresistance effect element 1b as bias magnetic fields.

In the example illustrated in FIG. 4, the bias magnetic field applying unit 31 is disposed near the magnetoresistance effect element 1a, the bias magnetic field applying unit 32 is disposed near the magnetoresistance effect elements 1a and 1b therebetween, and the bias magnetic field applying unit 33 is disposed near the magnetoresistance effect element 1b.

In this embodiment, the direction of a bias magnetic field applied by the bias magnetic field applying unit 31 and the bias magnetic field applying unit 32 having the magnetoresistance effect element 1a interposed therebetween and the direction of a bias magnetic field applied by the bias magnetic field applying unit 32 and the bias magnetic field applying unit 33 having the magnetoresistance effect element 1b interposed therebetween are opposite directions. In addition, in this embodiment, the bias magnetic field applying unit 32 is shared by the magnetoresistance effect element 1a and the magnetoresistance effect element 1b.

Here, in this embodiment although a case in which the magnetic field sensor 103 includes all the constituent elements illustrated in FIG. 4 is described, as another example, similar to the magnetic field sensor 101 according to the first embodiment illustrated in FIG. 1, a configuration of the magnetic field sensor 103 not including some of the constituent elements illustrated in FIG. 4 may be used.

In the magnetic field sensor 103, in a state in which bias magnetic fields of opposite directions are applied to the magnetoresistance effect element 1a and the magnetoresistance effect element 1b by the bias magnetic field applying units 31 to 33, detection of an external magnetic field is performed.

In this embodiment, a bias magnetic field (first bias magnetic field) applied to the magnetoresistance effect element 1a by the bias magnetic field applying units 31 and 32 is in the same direction as that of an external magnetic field of the detection target, and a bias magnetic field (second bias magnetic field) applied to the magnetoresistance effect element 1b by the bias magnetic field applying units 32 and 33 is in direction opposite to the direction of an external magnetic field of the detection target. In this state, when an external magnetic field is applied, the intensity of the magnetic field applied to the magnetoresistance effect element 1a in the spin torque oscillation state is an intensity corresponding to a sum of the first bias magnetic field and the external magnetic field. In addition, the intensity of the magnetic field applied to the magnetoresistance effect element 1b in the spin torque diode state is an intensity corresponding to a difference between the second bias magnetic field and the external magnetic field. In other words, when an external magnetic field of the detection target increases, the intensity of the magnetic field applied to the magnetoresistance effect element 1a increases, and the intensity of the magnetic field applied to the magnetoresistance effect element 1b decreases. Accordingly, at this time, the spin torque oscillation frequency of the magnetoresistance effect element 1a increases, and the spin torque resonance frequency of the magnetoresistance effect element 1b decreases. In this way, in accordance with a change in the intensity of the external magnetic field of the detection target, the spin torque oscillation frequency of the magnetoresistance effect element 1a and the spin torque resonance frequency of the magnetoresistance effect element 1b change (shift) in opposite directions. Here, in a case in which the spin torque oscillation frequency of the magnetoresistance effect element 1a is higher than the spin torque resonance frequency of the magnetoresistance effect element 1b, the magnetic field sensor 103 can function as a high-sensitivity magnetic field sensor of which the shift amount of the output voltage is large.

Figure 5:
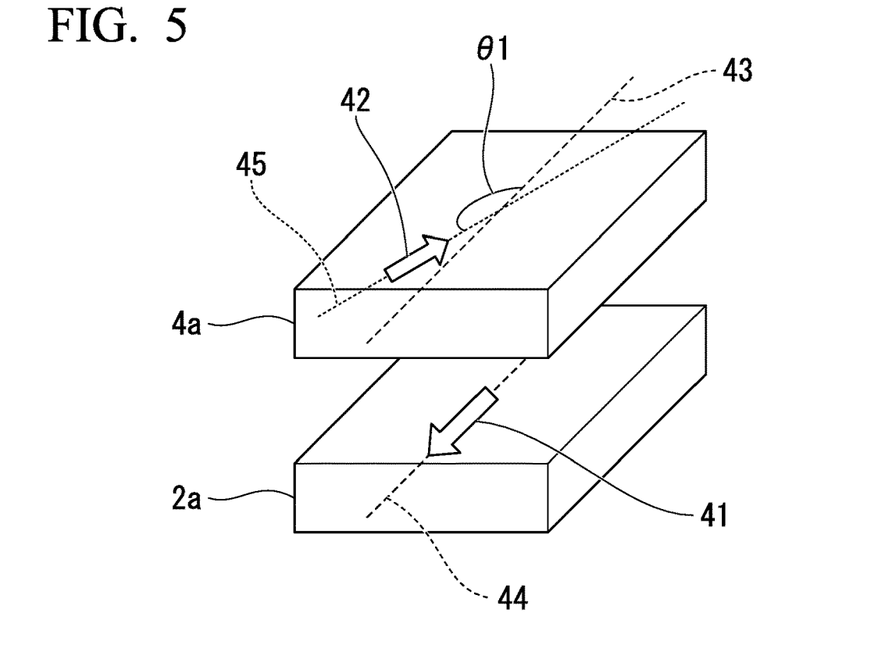
FIG. 5 is a schematic diagram of a magnetization state of a magnetoresistance effect element when a bias magnetic field is applied to the magnetoresistance effect element according to the third embodiment of the present disclosure using a bias magnetic field applying unit.

FIG. 5 is a schematic diagram of a magnetization state of the magnetoresistance effect element 1a when the first bias magnetic field is applied to the magnetoresistance effect element 1a according to the third embodiment of the present disclosure using the bias magnetic field applying units 31 and 32.

As illustrated in FIG. 5, in the magnetoresistance effect element 1a, the bias magnetic field applying units 31 and 32 are preferably disposed with respect to the magnetoresistance effect element 1a such that an angle θ1 formed by the direction of magnetization 41 of the magnetization fixed layer 2a and the direction of the first bias magnetic field of the magnetization free layer 4a generated by the bias magnetic field applying units 31 and 32 is 170 degrees or more and 190 degrees or less (for example, about 180 degrees). In FIG. 5, straight lines parallel to the direction of the magnetization 41 of the magnetization fixed layer 2a are represented by a straight line 43 and a straight line 44, and a straight line parallel to the direction of the first bias magnetic field is represented by a straight line 45.

In addition, when a DC current or a DC voltage is not applied to the magnetoresistance effect element 1a, and the first bias magnetic field is applied by the bias magnetic field applying units 31 and 32, the magnetization 42 of the magnetization free layer 4a is oriented in the same direction as that of the first bias magnetic field. The oscillation performance of the spin torque oscillation of the magnetoresistance effect element 1a has a correlation with the amount of change in the resistance value of the magnetoresistance effect element 1a oscillating at a spin torque oscillation frequency. In other words, in a case in which the angle θ1 between a rotation axis at which the magnetization 42 of the magnetization free layer 4a causes precession and the magnetization 41 of the magnetization fixed layer 2a is 170 degrees or more and 190 degrees or less (an antiparallel state thereof), the resistance value of the magnetoresistance effect element 1a greatly oscillates, and accordingly, the magnetoresistance effect element 1a can maintain an oscillation state having a good oscillation characteristic (high Q value). For this reason, the magnetic field sensor 103 can function as a magnetic field sensor having high sensitivity.

The example illustrated in FIG. 5 is an example, and thus any other configuration may be used.

Figure 6:
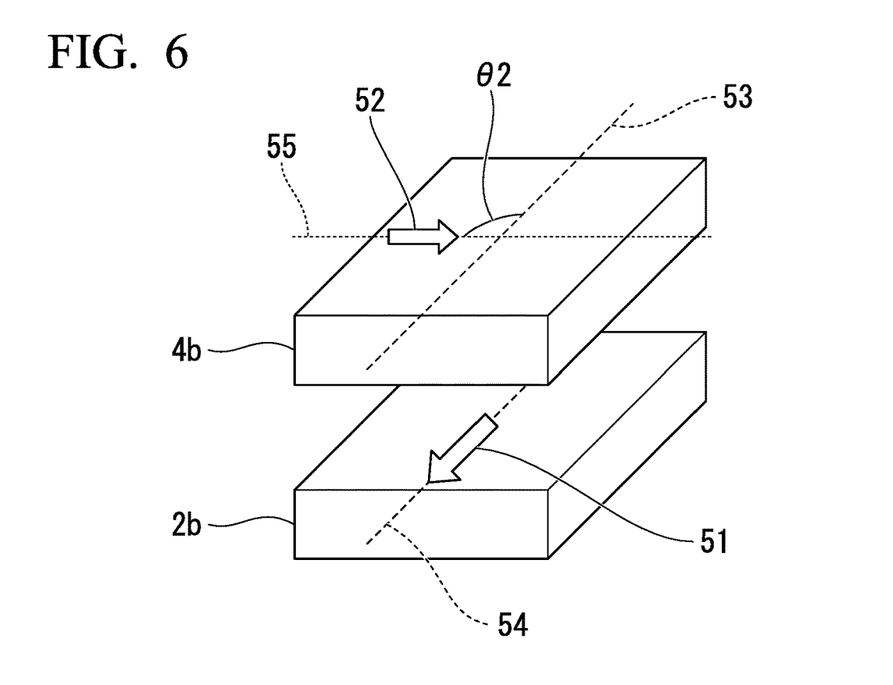
FIG. 6 is a schematic diagram of a magnetization state of the magnetoresistance effect element when a bias magnetic field is applied to the magnetoresistance effect element according to the third embodiment of the present disclosure using a bias magnetic field applying unit.

FIG. 6 is a schematic diagram of a magnetization state of the magnetoresistance effect element 1b when a second bias magnetic field is applied to the magnetoresistance effect element 1b according to the third embodiment of the present disclosure using bias magnetic field applying units 32 and 33.

As illustrated in FIG. 6, the bias magnetic field applying unit 32 and 33 are preferably disposed with respect to the magnetoresistance effect element 1b such that an angle θ2 formed by the direction of magnetization 51 of the magnetization fixed layer 2b and the direction of the second bias magnetic field of the magnetization free layer 4b generated by the bias magnetic field applying unit 32 and 33 is 80 degrees or more and 100 degrees or less (for example, about 90 degrees). In FIG. 6, straight lines parallel to the direction of the magnetization 51 of the magnetization fixed layer 2b are represented by a straight line 53 and a straight line 54, and a straight line parallel to the direction of the second bias magnetic field is represented by a straight line 55.

In addition, when a DC current, a DC voltage, or a high-frequency current is not applied to the magnetoresistance effect element 1b, and the second bias magnetic field is applied by the bias magnetic field applying unit 32 and 33, the magnetization 52 of the magnetization free layer 4b is oriented in the same direction as that of the second bias magnetic field. In a spin torque diode effect, from a state in which the magnetization 52 of the magnetization free layer 4a is stopped, magnetization 52 of the magnetization free layer 4a oscillates at a spin torque resonance frequency using an input high-frequency signal. For this reason, when a magnetic field condition in which the magnetization 52 of the magnetization free layer 4a easily oscillates is formed, the diode sensitivity is the highest. In other words, in a case in which the angle θ2 between the magnetization 52 of the magnetization free layer 4b and the magnetization 51 of the magnetization fixed layer 2b is 80 degrees or more and 100 degrees or less, the magnetization 52 of the magnetization free layer 4b easily oscillates, and accordingly, the diode sensitivity (a conversion ratio of rectification) of the magnetoresistance effect element 1b increases. For this reason, the magnetic field sensor 103 can function as a magnetic field sensor having high sensitivity.

The example illustrated in FIG. 6 is an example, and thus any other configuration may be used.

Figure 7:
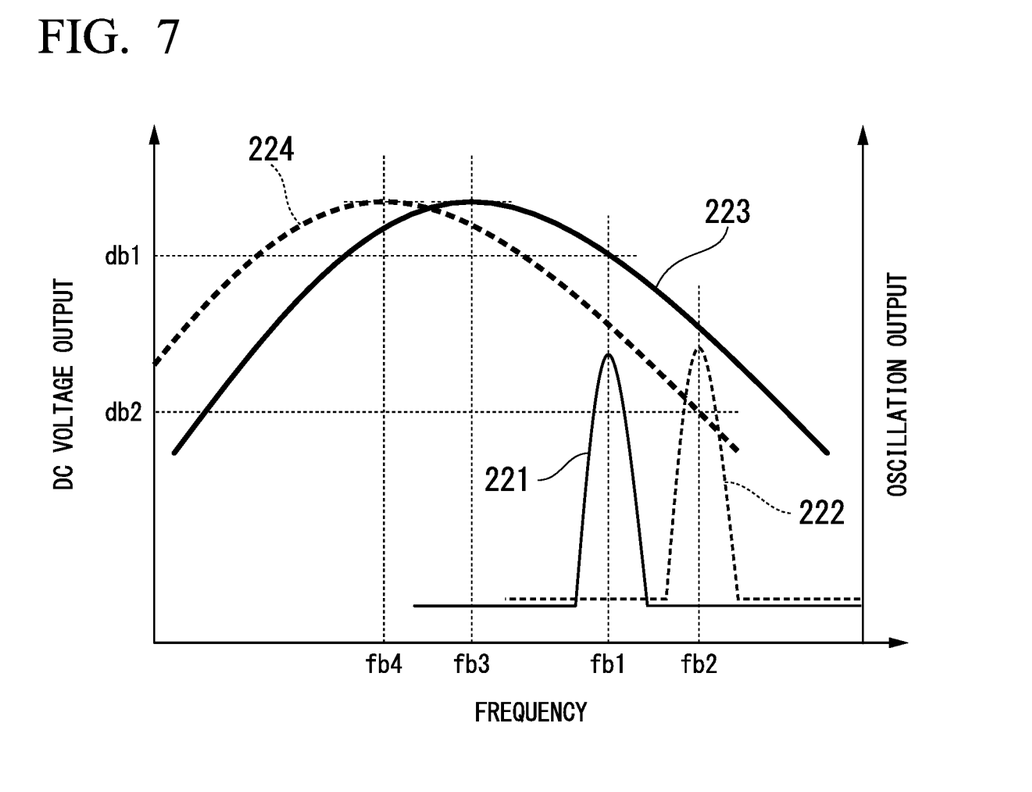
FIG. 7 is a diagram illustrating a graph representing spin torque oscillation according to the third embodiment of the present disclosure and a relation between the frequency of spin torque resonance and a DC voltage output and an oscillation output.

FIG. 7 is a diagram illustrating a graph representing spin torque oscillation according to the third embodiment of the present disclosure and a relationship between the frequency of spin torque resonance and a DC voltage output and an oscillation output. The example illustrated in FIG. 7 illustrates a case in which the spin torque oscillation frequency of the magnetoresistance effect element 1a is higher than the spin torque resonance frequency of the magnetoresistance effect element 1b.

In the graph illustrated in FIG. 7, a vertical axis on the left side represents a DC voltage output from the magnetoresistance effect element 1b, a vertical axis on the right side represents an oscillation output from the magnetoresistance effect element 1a, and the horizontal axis represents the frequency. In the example illustrated in FIG. 7, graphs acquired when magnetic fields applied to the magnetoresistance effect elements 1a and 1b change are illustrated.

In the example illustrated in FIG. 7, a plot line of a characteristic 221 is a characteristic acquired when the intensity of the external magnetic field of the detection target, applied from the outside to the magnetoresistance effect element 1a is Ba1, and a plot line of a characteristic 222 is a characteristic acquired when the intensity of the external magnetic field of the detection target, applied from the outside to the magnetoresistance effect element 1a is Ba2. The relation between the intensities of such external magnetic fields is Ba1<Ba2.

In the example illustrated in FIG. 7, a plot line of a characteristic 223 is a characteristic acquired when the intensity of the external magnetic field of the detection target, applied from the outside to the magnetoresistance effect element 1b is Ba1, and a plot line of a characteristic 224 is a characteristic acquired when the intensity of the external magnetic field applied from the outside to the magnetoresistance effect element 1b is Ba2.

As illustrated in FIG. 7, in a case in which the intensity of an external magnetic field applied from the outside to the magnetoresistance effect elements 1a and 1b changes (shifts) from Ba1 to Ba2 (Ba2 being higher than Ba1), as the intensity of the magnetic field applied to the magnetoresistance effect element 1a increases, the frequency of a high-frequency signal output from the magnetoresistance effect element 1a changes (shifts) from fb1 to fb2 which is higher than fb1. In addition, in this case, as the intensity of the magnetic field applied to the magnetoresistance effect element 1b decreases, the spin torque resonance frequency of the magnetoresistance effect element 1b changes (shifts) from fb3 to fb4 (fb4 being lower than fb3). In other words, a direction in which the spin torque oscillation frequency of the magnetoresistance effect element 1a shifts and a direction in which the spin torque resonance frequency of the magnetoresistance effect element 1b shifts are opposite directions. For this reason, as illustrated in FIG. 7, the amount of change in the output voltage (db1−db2) when the intensity of an external magnetic field of the detection target changes can be increased. In this way, the magnetic field sensor 103 can output a high voltage change with respect to the amount of change in the intensity of an external magnetic field of the detection target, whereby a magnetic field sensor having high sensitivity can be realized.

As another example, a case in which the spin torque oscillation frequency of the magnetoresistance effect element 1a is lower than the spin torque resonance frequency of the magnetoresistance effect element 1b may be used. In such a case, for example, the first bias magnetic field is in a direction opposite to the direction of the external magnetic field of the detection target, and the second bias magnetic field is in the same direction as the direction of the external magnetic field of the detection target. In this case, when the external magnetic field of the detection target increases, the intensity of the magnetic field applied to the magnetoresistance effect element 1a decreases, and the intensity of the magnetic field applied to the magnetoresistance effect element 1b increases. Also in this case, a direction in which the spin torque oscillation frequency of the magnetoresistance effect element 1a shifts and a direction in which the spin torque resonance frequency of the magnetoresistance effect element 1b shifts are opposite directions. Thus, by utilizing this, the amount of change in the output voltage when the intensity of the external magnetic field of the detection target changes can be configured to be large.

As above, similar to the case of the first embodiment, the magnetic field sensor 103 according to this embodiment can be configured to have a simple configuration, whereby high sensitivity can be realized.

In addition, the magnetic field sensor 103 according to this embodiment includes the bias magnetic field applying unit 31 to 33 that apply a bias magnetic field (first bias magnetic field) to the magnetoresistance effect element 1a (first magnetoresistance effect element) and apply a bias magnetic field (second bias magnetic field) to the magnetoresistance effect element 1b (second magnetoresistance effect element). The first bias magnetic field and the second bias magnetic field have components of opposite directions. In this embodiment, while the first bias magnetic field and the second bias magnetic field are magnetic fields of the opposite directions, in a case in which the first bias magnetic field and the second bias magnetic field have components of opposite directions, similar to the magnetic field sensor 103 according to this embodiment, the amount of change in the output voltage when the intensity of an external magnetic field of the detection target changes can be configured to be large.

In addition, the magnetic field sensor 103 according to this embodiment may not include a magnetic shield for the magnetoresistance effect element 1b.

Here, also the magnetic field sensor 103 according to this embodiment, similar to the case of the second embodiment, may include constituent elements similar to the inductor 10b, the input terminal 11b, and the power supply 13b illustrated in FIG. 3.

As above, while the embodiments of the present disclosure have been described in detail with reference to the drawings, a specific configuration is not limited thereto and includes a design change and the like in a range not departing from the concept of the present disclosure.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A magnetic field sensor comprising:
a first magnetoresistance effect element;
a second magnetoresistance effect element;
an output port;
a signal line that includes a first part, a second part and a branch part;
a capacitor; and
a first input terminal configured to apply a DC current or a DC voltage to the first magnetoresistance effect element, wherein:
each of the first magnetoresistance effect element and the second magnetoresistance effect element includes a first magnetic layer, a second magnetic layer, and a spacer layer disposed therebetween;
the first magnetoresistance effect element and the second magnetoresistance effect element are electrically connected through the first part and the second part of the signal line and the capacitor;
the first magnetoresistance effect element and the capacitor are electrically connected through the first part of the signal line;
the capacitor and the second magnetoresistance effect element are electrically connected through the second part of the signal line;
the first magnetoresistance effect element, the capacitor and the second magnetoresistance effect element are electrically connected in series in that order;
the branch part is connected to the second part; and
the output port is connected to the branch part.

2. The magnetic field sensor according to claim 1, further comprising a second input terminal configured to apply a DC current or a DC voltage to the second magnetoresistance effect element.

3. The magnetic field sensor according to claim 1, further comprising:
a bias magnetic field applying unit configured to apply a first bias magnetic field to the first magnetoresistance effect element and to apply a second bias magnetic field to the second magnetoresistance effect element,
wherein the first bias magnetic field and the second bias magnetic field have components of opposite directions.

4. The magnetic field sensor according to claim 1, wherein the first magnetoresistance effect element is configured for an external magnetic field of a detection target to be applied, and the first magnetoresistance effect element is configured to function as an oscillation element generating a high-frequency signal.

5. The magnetic field sensor according to claim 1, further comprising a magnetic shield on a periphery of the second magnetoresistance effect element.

6. A magnetic field sensor comprising:
a first magnetoresistance effect element;
a second magnetoresistance effect element;
an output port;
a signal line that includes a first part and a second part;
a capacitor; and
a first input terminal configured to apply a DC current or a DC voltage to the first magnetoresistance effect element, wherein:
each of the first magnetoresistance effect element and the second magnetoresistance effect element includes a first magnetic layer, a second magnetic layer, and a spacer layer disposed therebetween;
the first magnetoresistance effect element and the second magnetoresistance effect element are electrically connected through the first part and the second part of the signal line and the capacitor;
the output port is configured to output a DC output voltage from the second magnetoresistance effect element;
the first magnetoresistance effect element and the capacitor are electrically connected through the first part of the signal line;
the capacitor and the second magnetoresistance effect element are electrically connected through the second part of the signal line; and
the first magnetoresistance effect element, the capacitor and the second magnetoresistance effect element are electrically connected in series in that order.

7. The magnetic field sensor according to claim 6, further comprising a second input terminal configured to apply a DC current or a DC voltage to the second magnetoresistance effect element.

8. The magnetic field sensor according to claim 6, further comprising:
a bias magnetic field applying unit configured to apply a first bias magnetic field to the first magnetoresistance effect element and to apply a second bias magnetic field to the second magnetoresistance effect element,
wherein the first bias magnetic field and the second bias magnetic field have components of opposite directions.

9. The magnetic field sensor according to claim 6, wherein the first magnetoresistance effect element is configured for an external magnetic field of a detection target to be applied, and the first magnetoresistance effect element is configured to function as an oscillation element generating a high-frequency signal.

10. The magnetic field sensor according to claim 6, further comprising a magnetic shield on a periphery of the second magnetoresistance effect element.

11. A magnetic field sensor comprising:
a first magnetoresistance effect element;
a second magnetoresistance effect element;
an output port;
a signal line;
a first input terminal configured to apply a DC current or a DC voltage to the first magnetoresistance effect element;
a magnetic shield on a periphery of the second magnetoresistance effect element; and
a magnetic field applying unti configured to apply a static magnetic field to the second magnetoresistance effect element, wherein:
each of the first magnetoresistance effect element and the second magnetoresistance effect element includes a first magnetic layer, a second magnetic layer, and a spacer layer disposed therebetween;
the first magnetoresistance effect element and the second magnetoresistance effect element are electrically connected through the signal line;
the output port is connected to a branch line that is connected to the signal line between the first magnetoresistance effect element and the second magnetoresistance effect element; and
the magnetic shield is configured to surround the second magnetoresistance effect element and the magnetic field applying unit.

12. A magnetic field sensor comprising:
a first magnetoresistance effect element;
a second magnetoresistance effect element;
an output port;
a signal line;

a first input terminal configured to apply a DC current or a DC voltage to the first magnetoresistance effect element;

a magnetic shield on a periphery of the second magnetoresistance effect element; and a magnetic field applying unit configured to apply a static magnetic field to the second magnetoresistance effect element, wherein:

each of the first magnetoresistance effect element and the second magnetoresistance effect element includes a first magnetic layer, a second magnetic layer, and a spacer layer disposed therebetween;

the first magnetoresistance effect element and the second magnetoresistance effect element are electrically connected through the signal line;

the output port is configured to output a DC output voltage from the second magnetoresistance effect element; and the magnetic shield is configured to surround the second magnetoresistance effect element and the magnetic field applying unit.

* * * * *